United States Patent [19]

Horiguchi et al.

[11] Patent Number: 5,449,939
[45] Date of Patent: Sep. 12, 1995

[54] SEMICONDUCTOR DEVICE HAVING A PROTECTIVE TRANSISTOR

[75] Inventors: Yoko Horiguchi; Kaoru Narita, both of Tokyo, Japan

[73] Assignee: NEC Corporation, Tokyo, Japan

[21] Appl. No.: 364,275

[22] Filed: Dec. 27, 1994

[30] Foreign Application Priority Data

Dec. 29, 1993 [JP] Japan .................................. 5-353167

[51] Int. Cl.6 ...................... H01L 29/06; H01L 29/78
[52] U.S. Cl. .................................. 257/360; 257/362; 257/363; 257/378; 257/379
[58] Field of Search ................ 257/358, 359, 360, 362, 257/363, 378, 379

[56] References Cited

U.S. PATENT DOCUMENTS 4,893,157  1/1990  Miyazawa et al. .................. 257/360
5,291,051  3/1994  Hoang et al. ....................... 257/360

FOREIGN PATENT DOCUMENTS 4122059  4/1992  Japan .

Primary Examiner—Ngân V. Ngô
Attorney, Agent, or Firm—Sughrue, Mion, Zinn, Macpeak & Seas

[57] ABSTRACT

A semiconductor device has an internal circuit, an output transistor and a protective transistor for protecting the output transistor and the internal circuit against an ESD-induced destruction caused by a surge pulse entering from an input/output terminal. The sum of a first distance between a contact for connecting an input/output terminal with the collector of the protective transistor and a field oxide film and a second distance between a contact for connecting the input/output terminal with the emitter of the protective transistor and the field oxide film overlying the base of the laterally formed protective transistor is made smaller than the sum of a third distance between a contact for connecting the input/output terminal with the drain of the output transistor and the gate electrode of the output transistor and a fourth distance between a contact for connecting a potential line with the source of the output transistor and the gate electrode of the output transistor. Besides, the effective channel length of the output transistor is made longer than the effective base width of the protective transistor.

6 Claims, 9 Drawing Sheets

SEMICONDUCTOR DEVICE HAVING A PROTECTIVE TRANSISTOR

BACKGROUND OF THE INVENTION

1. Field of the Invention

The present invention relates to a semiconductor device and, more particularly, to a semiconductor device having a protective transistor for protecting an internal circuit against an electrostatic discharge (ESD)-induced destruction.

2. Description of the Related Art

A conventional protective circuit for protecting a semiconductor integrated circuit (IC) against an ESD-induced destruction is described, for example, in JP-A-92-122059. FIG. 1 is an equivalent circuit of an input/output section of the conventional protective circuit as mentioned above. FIG. 2 is a plan view of a pattern layout therefor and FIG. 3 is a cross-sectional view taken along line III—III in FIG. 2. The input/output section has a function for both inputting and outputting a signal between an internal circuit 50 and the input/output terminal 1 of the semiconductor device.

In the circuit shown in FIG. 1, when a high-voltage surge pulse is applied to the input/output metallic terminal 1 due to an electrostatic charge entering from outside the device, a surge current flows through parasitic capacitors of an output transistor 2 and a signal path 100 as well as through an input resistor 3 and a signal path 101 to an internal circuit 50, thereby causing a destruction of the semiconductor device. For avoiding such a destruction, a protective transistor 4 is provided in a vicinity of the input/output terminal 1 for protecting both of the output transistor 2 and the internal circuit 50 against the destruction through forming a discharge path. The protective transistor 4 is implemented by a bipolar transistor having a high current capacity. When a high-voltage surge pulse is applied to a collector of the protective transistor 4, the protective transistor 4 turns conductive to thereby clamp the applied voltage below an absolute breakdown voltage of the device.

As shown in FIG. 3, the output transistor 2 is implemented by an NMOSFET having a lightly doped drain (LDD) structure including an N-type diffused layers 6 and 7 formed in a P-type semiconductor substrate 5 together with a gate electrode 8. A gate oxide film 15 is formed between the semiconductor substrate 5 and the gate electrode 8. N-type diffused layer 6 constituting a source of the output transistor 2 is connected to a ground line through an aluminium interconnection 9. N-type diffused layer 7 constituting a drain of the output transistor 2 is connected to the input/output terminal 1 through an aluminium interconnection 10. The gate electrode 8 is isolated from the aluminum interconnections 9 and 10 by sidewall spacers 16 and an interlayer insulating film 17.

The protective transistor 4 is implemented by a laterally formed NPN bipolar transistor wherein a portion of the P-type semiconductor substrate 5 constitutes a base, N-type diffused layer 7 constitutes a collector and an N-type diffused layer 11 constitutes an emitter. The base region located between N-type diffused layers 7 and 11 is covered by a field oxide film 18. N-type diffused layer 7 constituting the collector of the protective transistor 4 is connected to the input/output terminal 1 through the aluminium interconnection 10. N-type diffused layer 11 constituting the emitter of the protective transistor 4 is connected to the ground line through an aluminum interconnection 12.

In the semiconductor device as described above, the drain of the output transistor 2 and the collector of the protective transistor 4 are formed in common as N-type diffused layer 7, whereby reduction both in the chip area occupied by the semiconductor device and in parasitic capacitance of the input/output terminal 1 can be obtained.

SUMMARY OF THE INVENTION

It is an object of the present invention to provide a semiconductor device, in which an output transistor and an internal circuit are more effectively protected against an ESD-induced destruction by using an improved protective circuit structure.

In accordance with the present invention, there is provided a semiconductor device comprising: a substrate having a semiconductive region of a first conductivity type; an internal circuit formed overlying and within the substrate; an input/output terminal for inputting/outputting signals for or from the internal circuit; a first and a second potential lines overlying the substrate; an output transistor including a gate electrode connected to the internal circuit and including in the semiconductive region a drain region electrically connected to the input/output terminal and a source region electrically connected to the first potential line, each of the source region and drain region having a second conductivity type opposite to the first conductivity type; a protective transistor including an emitter region formed in the semiconductive region, a collector implemented by the drain region and a base implemented by a portion of the semiconductive region, the emitter region having the second conductivity type and electrically connected to one of the first and second potential lines; and a field oxide film formed on the semiconductive region and interposed between the drain region and the emitter region, wherein a first parasitic resistance formed along a first path from the input/output terminal through the protective transistor to the one of the first and second potential lines is smaller than a second parasitic resistance formed along a second path from the input/output terminal through the output transistor to the first potential line.

In order to make the first parasitic resistance of the first path formed by the protective transistor smaller than the second parasitic resistance of the second path formed by the output transistor, it is desirable that the sum of a first distance between a first contact for connecting the input/output terminal with the first diffused region and the field oxide film overlying the base region and a second distance between a second contact for connecting a first or a second potential line with the third diffused region and the field oxide film is smaller than the sum of a third distance between a contact for connecting the input/output terminal with the third diffused region and the gate electrode of the output transistor and a fourth distance between a fourth contact for connecting the first potential line with the fourth diffused region and the gate electrode of the output transistor.

Besides, in the semiconductor device according to the present invention, it is possible to operate the protective transistor more effectively, by making the effective base width of the laterally formed protective transistor smaller than the effective channel length of the output transistor. Moreover, a refractory metal silicide pad intervening between the fourth contact electrode and the fourth diffused region or intervening between the first potential line and the fourth diffused region raises the effectiveness of the protective transistor because the pad increases the series resistance of the output transistor.

In accordance with the semiconductor device according to the present invention, when a high-voltage surge pulse is applied to the input/output terminal due to an electrostatic charge entering from outside the semiconductor device, the output transistor scarely operates as a parasitic bipolar transistor while the protective transistor having a larger current capacity operates primarily. As a result, most part of surge current flows through the protective transistor, thereby protecting both of the output transistor and the internal circuit to improve the ESD-induced destruction immunity of the semiconductor device.

BRIEF DESCRIPTION OF THE DRAWINGS

The above and other objects, features and advantages of the present invention will be more apparent from the following description, taken in conjunction with accompanying drawings in which.

DESCRIPTION OF THE PREFERRED EMBODIMENTS

Before describing embodiments of the present invention, problems and disadvantages involved in the conventional semiconductor devices will be described for a better understanding of the present invention.

Figure 1:
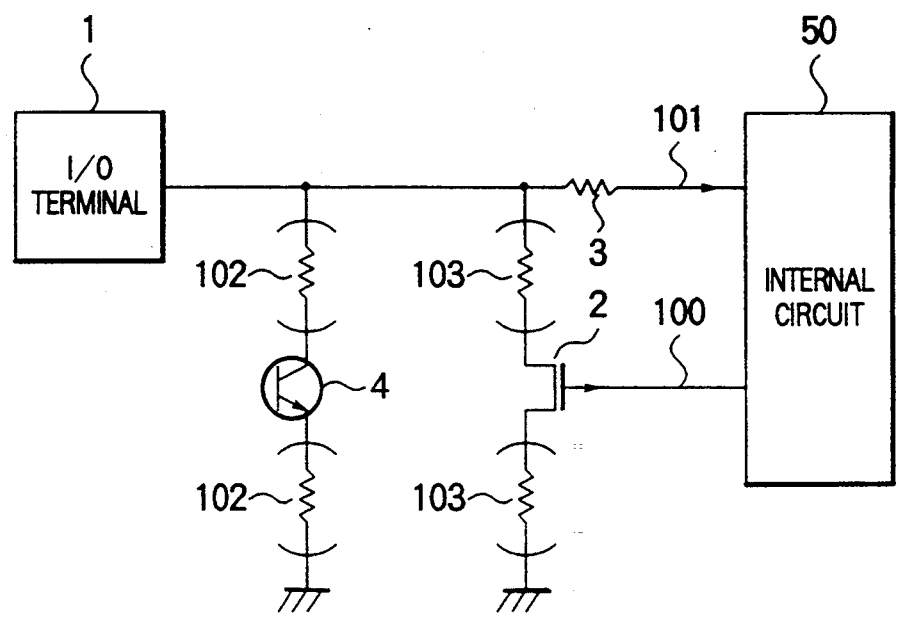
FIG. 1 is a circuit diagram of an input/output section of a conventional semiconductor device.
Figure 2:
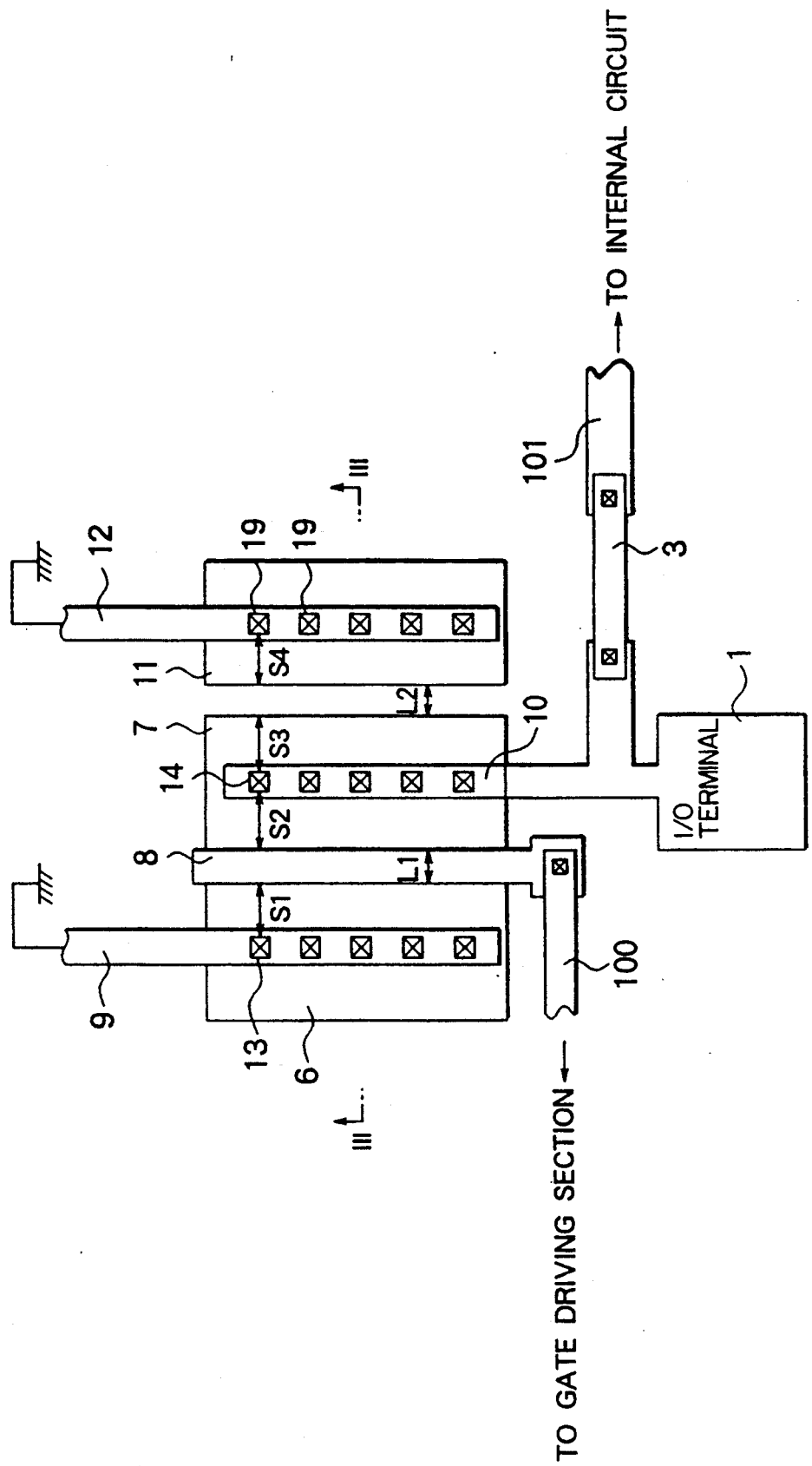
FIG. 2 is a plan view of the pattern layout for the input/output section of FIG. 1.
Figure 3:
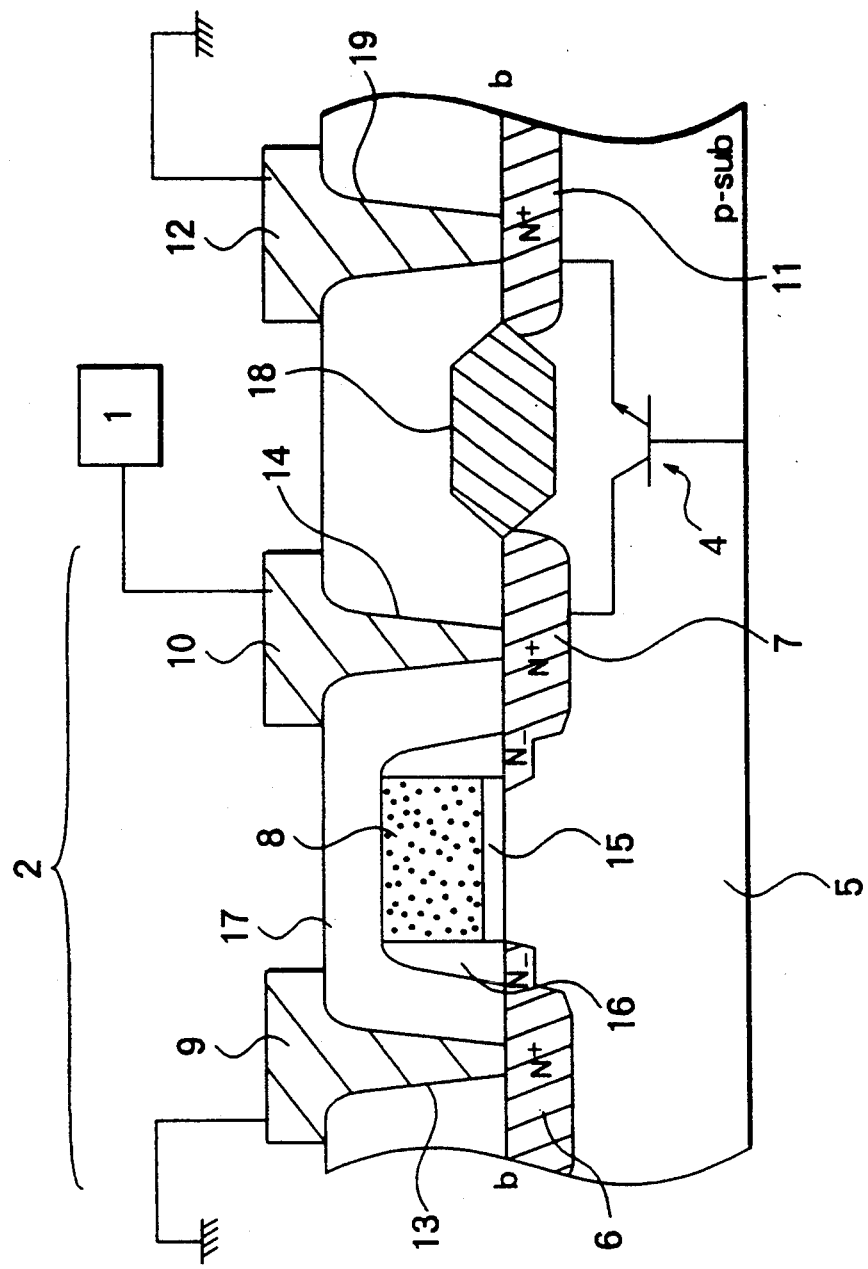
FIG. 3 is a cross-sectional view taken along line III—III in FIG. 2.

In FIGS. 1 and 2, in the conventional semiconductor device, a parasitic resistance 103, which is determined by a distance S1 (or S2) between the gate electrode 8 of the output transistor 2 and a source/drain contact 13 (or 14) of the output transistor 2 is substantially identical to a parasitic resistance 102, which is determined by a distance S3 (or S4) between a collector contact 14 (or an emitter contact 19) of the protective transistor 4 and the field oxide film 18. Those distances are actually decided by an updated fie pattern technology. Similarly, an effective channel length L1 of the output transistor 2 is substantially identical to an effective base width L2 of the protective transistor 4, which is decided in fact by a current LOCOS technology.

In the conventional semiconductor device described above, when a high-voltage surge pulse entering from outside the device is applied to the input/output terminal 1, the output N-channel MOSFET 2 operates as a parasitic lateral NPN bipolar transistor while the substrate 5 is maintained at −2 V, for example. Namely, all of the surge current entering through the input/output terminal 1 does not flow through the protective transistor 4 but a part of the surge current flows through the output NMOSFET 2 and through the internal circuit 50 to be protected, causing an ESD-induced destruction in the semiconductor device.

Besides, when the output transistor 2 is implemented by a MOS transistor having an LDD-structure to increase an integration density of the semiconductor device, an immunity against an ESD-induced destruction of the output transistor 2 is reduced due to the structure thereof. Accordingly, the ESD-induced destruction is likely to occur in the semiconductor device having a MOSFET formed in an LDD structure.

Figure 4:
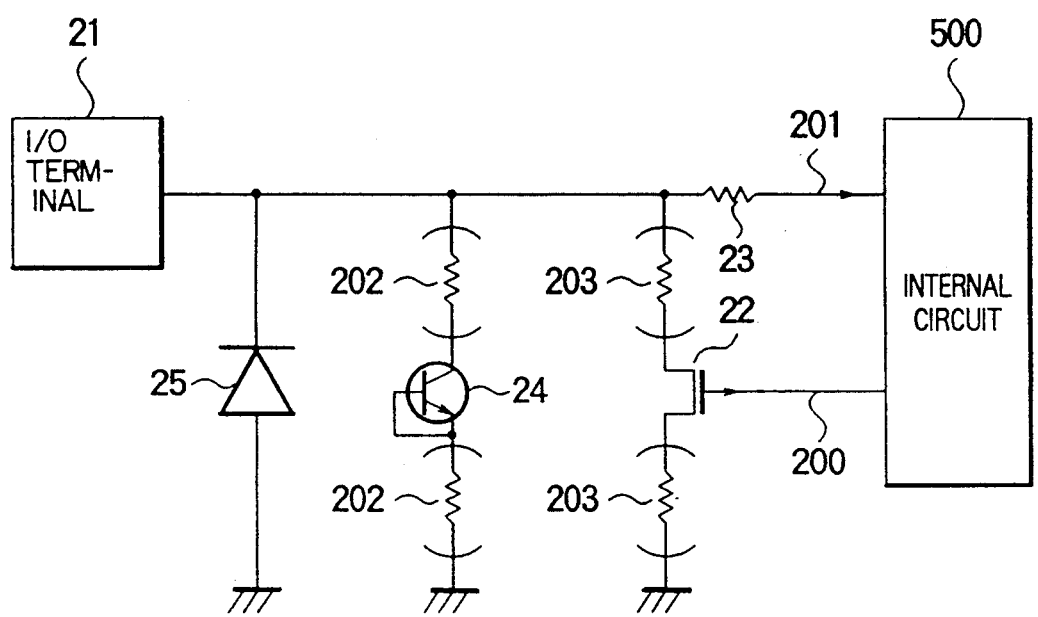
FIG. 4 is a circuit diagram of an input/output section in a semiconductor device according to a first embodiment of the present invention.
Figure 5:
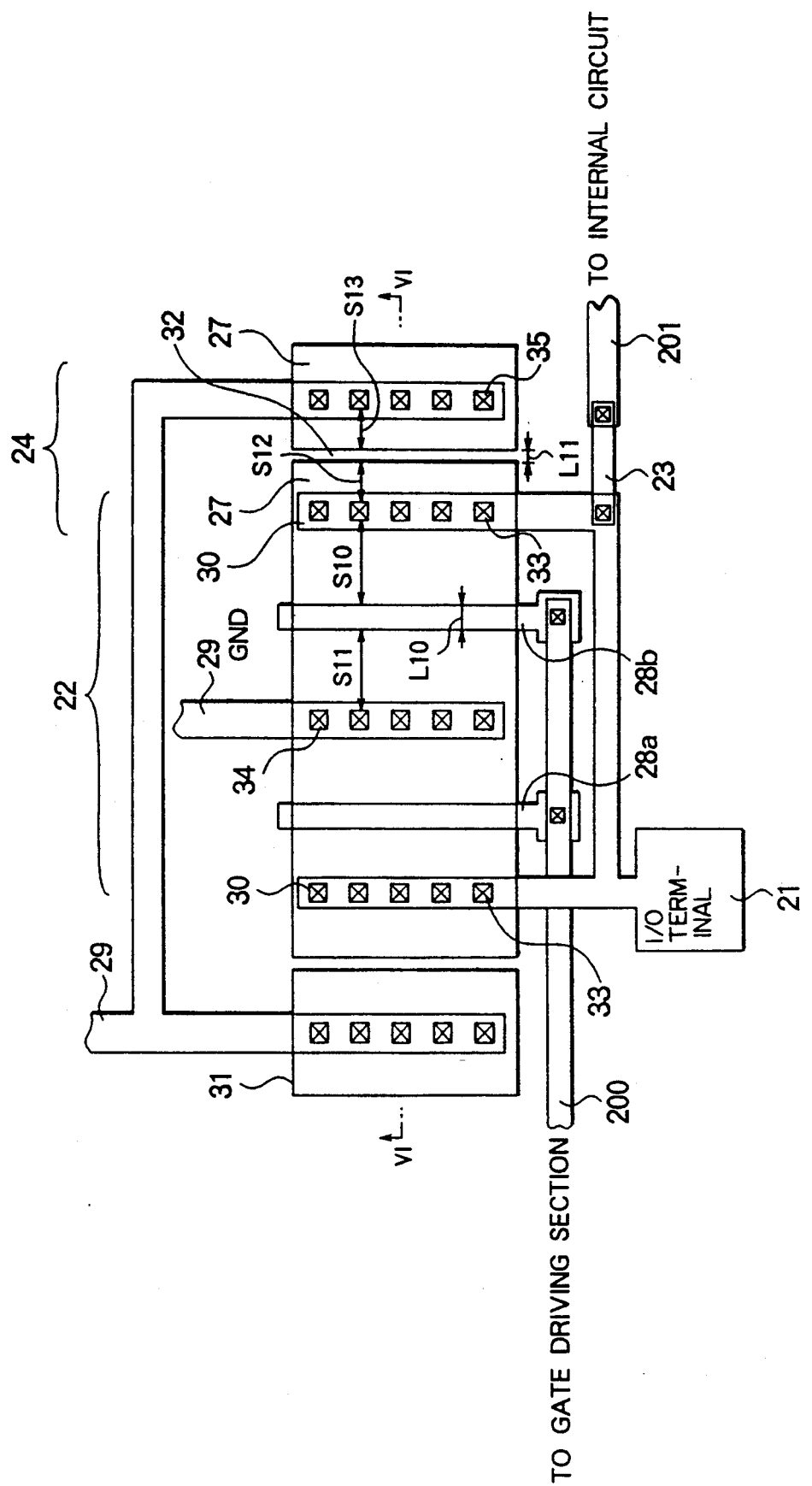
FIG. 5 is a plan view of the input/output section in FIG. 4.
Figure 6:
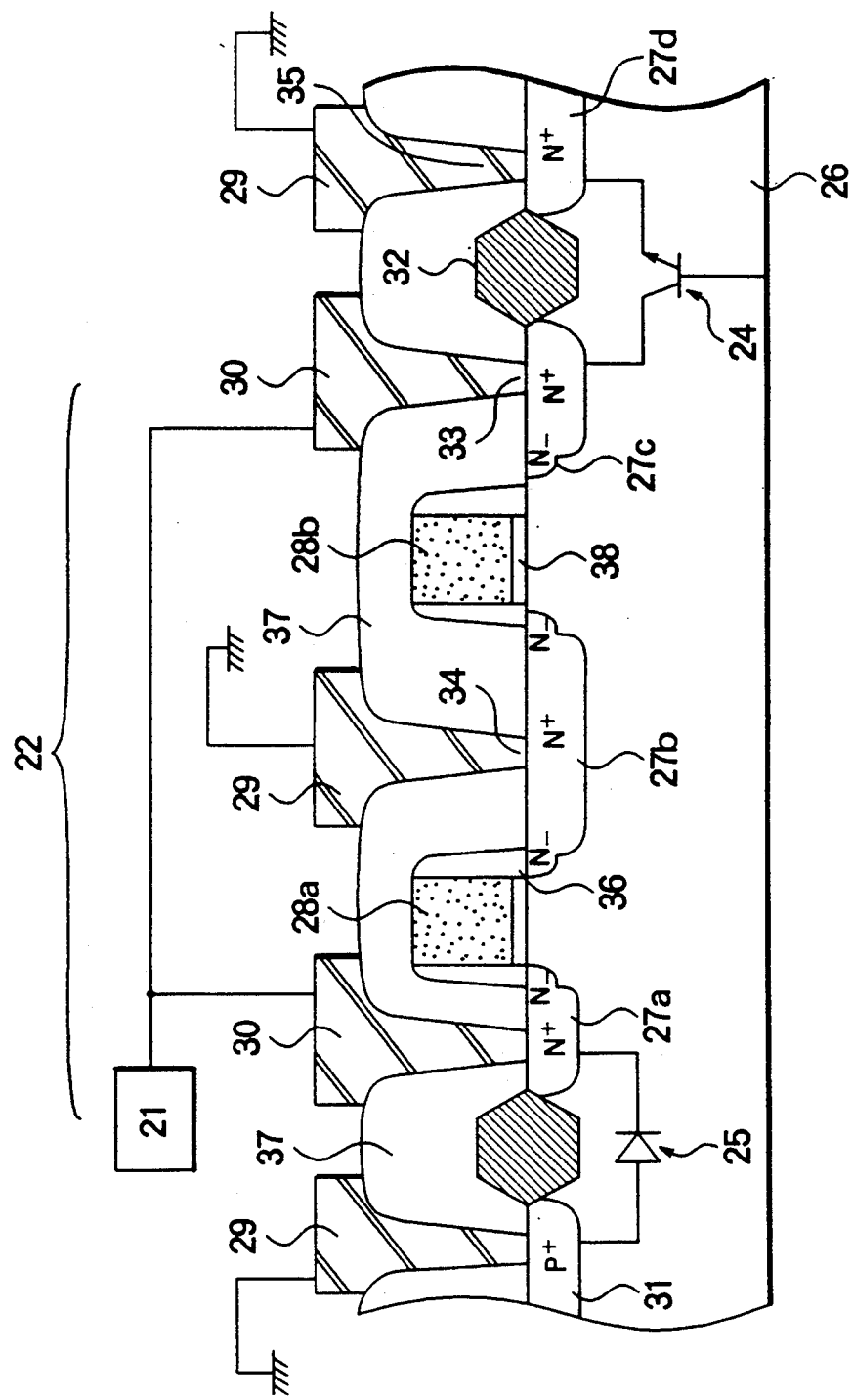
FIG. 6 is a cross-sectional view taken along the VI—VI in FIG. 5.

Now, a first embodiment of the present invention will be described with reference to the drawings. Referring to FIG. 4 through FIG. 6, there is shown an input/output section of a semiconductor device according to the first embodiment of the present invention.

In FIG. 4, a first terminal of an output transistor 22 is connected between a metallic input/output terminal 21 and an input resistor 23 of an internal circuit 500 through a parasitic resistance 203 while a second terminal of the output transistor 22 is connected to aground line 29 through a parasitic resistance 203. The resistor 23 is connected to an internal circuit 500 through a signal path 201. The gate of the output transistor 22 is also connected to a gate driving section of the internal circuit 500. The output transistor 22 functions for transmitting an output signal from the internal circuit 500. A protective transistor 24 and a protective diode 25 are also provided to form discharge paths for protecting the internal circuit 500 and the output transistor 22 against a surge current.

As shown in FIGS. 5 and 6, the output transistor 22 is implemented by an NMOSFET having an LDD structure including N-type diffused regions 27a, 27b and 27c formed in a P-type semiconductor substrate 26 together with gate electrodes 28a and 28b. The N-type diffused region 27b constituting the source region of the output transistor 22 is connected to a ground line, i.e., a first potential line through an aluminium interconnection 29. The N-type diffused regions 27a and 27c constituting the drain regions of the output transistor 22 are connected to the input/output terminal 21 through an aluminum interconnection 30. Although the source of the output transistor 22 is connected to the ground line in the present embodiment, the present invention is not limited thereto and the N-type diffused region 27b serving as the source of the output transistor 22 may be connected to a high-potential source line, for example, 3.3 V line.

On the other hand, the output transistor 22 has a first segment as depicted on the right hand-side thereof in the drawing including a source 27b, a gate 28b and a drain 27c as well as a second segment as depicted on the left handside thereof including a source 27b, a gate 28a and a drain 27a. The gate electrodes 28a and 28b of the output transistor 22 are connected to a signal path 200 which leads to a gate driving section of the internal circuit 500. In operation, the output transistor 22 is turned on and off by a drive signal transmitted from the gate driving section to control the electric potential at the input/output terminal 21. The gate electrodes 28a and 28b are isolated from the aluminium interconnections 29 and 30 by sidewall spaces 38 and an interlayer insulating film 37.

The protective diode 25 has a PN junction formed by a P-type diffused region 31, a portion of the P-type substrate 26 maintained at −2 V, for example, and the N-type diffused region 27a. The P-type diffused region 31 is connected to the ground line through the aluminum interconnection 29 while the N-type diffused region 27a is connected to the input/output terminal 21 through the aluminum interconnection 30.

The protective transistor 24 is implemented by an NPN lateral bipolar transistor in which a portion of the P-type semiconductor substrate 26 constitutes a base, the N-type diffused region 27c constitutes a collector and the N-type diffused region 27d constitutes an emitter. The field oxide film 32 covers the surface of the base region located between the N-type diffused regions 27c and 27d. The N-type diffused region 27c constituting the collector of the protective transistor 24 is connected to the input/output terminal 21 through the aluminum interconnection 30 while the N-type diffused region 27d constituting the emitter thereof is connected to the ground line through the aluminum interconnection 29.

In FIG. 5, a first distance S10 between the gate electrode 28b of the output transistor 22 and a contact 33 for connecting the aluminum interconnection 30 with the drain diffused region 27c and a second distance S11 between the gate electrode 28b and a contact 34 for connecting the aluminum interconnection 29 with the source diffused region 27b are both selected as 6 $\mu$m. On the other hand, a third distance S12 between the contact 33 for connecting the interconnection 30 with the collector diffused region 27b of the protective transistor 24 and the field oxide film 32 overlying the base region and a fourth distance S13 between a contact 35 for connecting the emitter diffused region 27d of the protective transistor 24 with the aluminum interconnection 29 and the field oxide film 32 are both selected as 2 $\mu$m.

With this configuration, assuming that the sheet resistivity of a diffused region is 50 $\Omega$ per square and that the channel width of the output transistor 22 is 10 $\mu$m, a total of parasitic resistances 203 shown in FIG. 4 is calculated as 30 $\Omega$, significantly higher as compared to the value of 20 $\Omega$ calculated for a total of parasitic resistances 202 of the protective transistors 24 shown in FIG. 4. Besides, the effective channel length L10 of the output transistor 22 defined by the polysilicon gate electrodes 28a and 28b is selected as 1.2 $\mu$m while the effective base width L11 of the protective transistor 24 is selected as 0.9 $\mu$m by a LOCOS technology, thereby making the effective channel length L10 of the output transistor 22 larger than the effective base width L11 of the protective transistor 24.

Hence, the output transistor 22 is hard to operate as a parasitic bipolar transistor even in case of a high-voltage surge pulse. Namely, when a positive high-voltage surge pulse is applied to the input/output terminal 21, the protective transistor 24 having a higher current capacity operates to turn conductive. As a result, almost all part of the surge current flows through the protective transistor 24, whereby an immunity against the ESD-induced destruction of the input/output section in the semiconductor device can be improved. When a negative high-voltage surge pulse is applied to the input/output terminal 21, a forward surge current flows through the protective diode 25, thereby protecting the output transistor 22.

Figure 7:
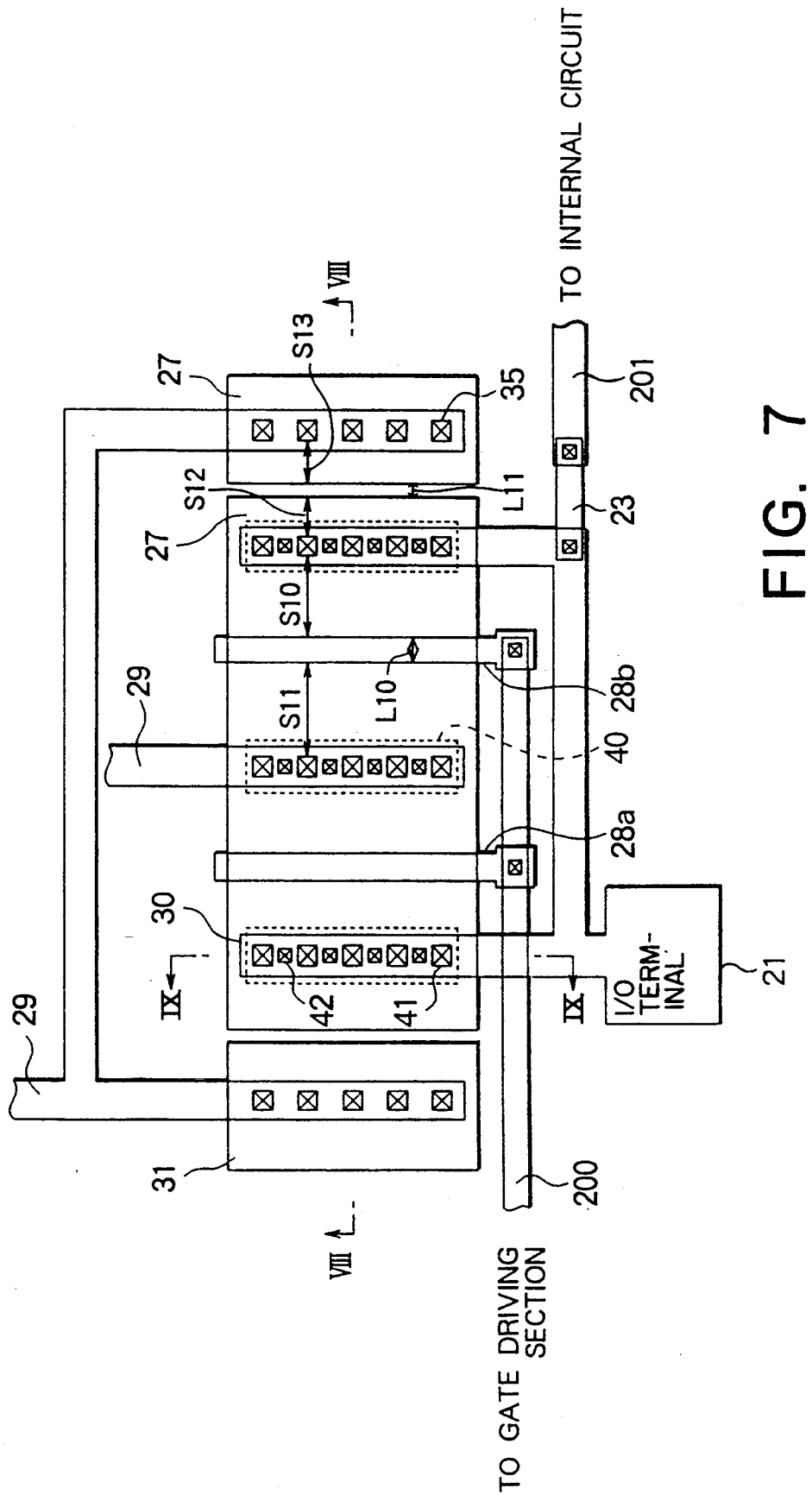
FIG. 7 is a plan view of the pattern layout for an input/output section of a semiconductor device according to a second embodiment of the present invention.
Figure 8:
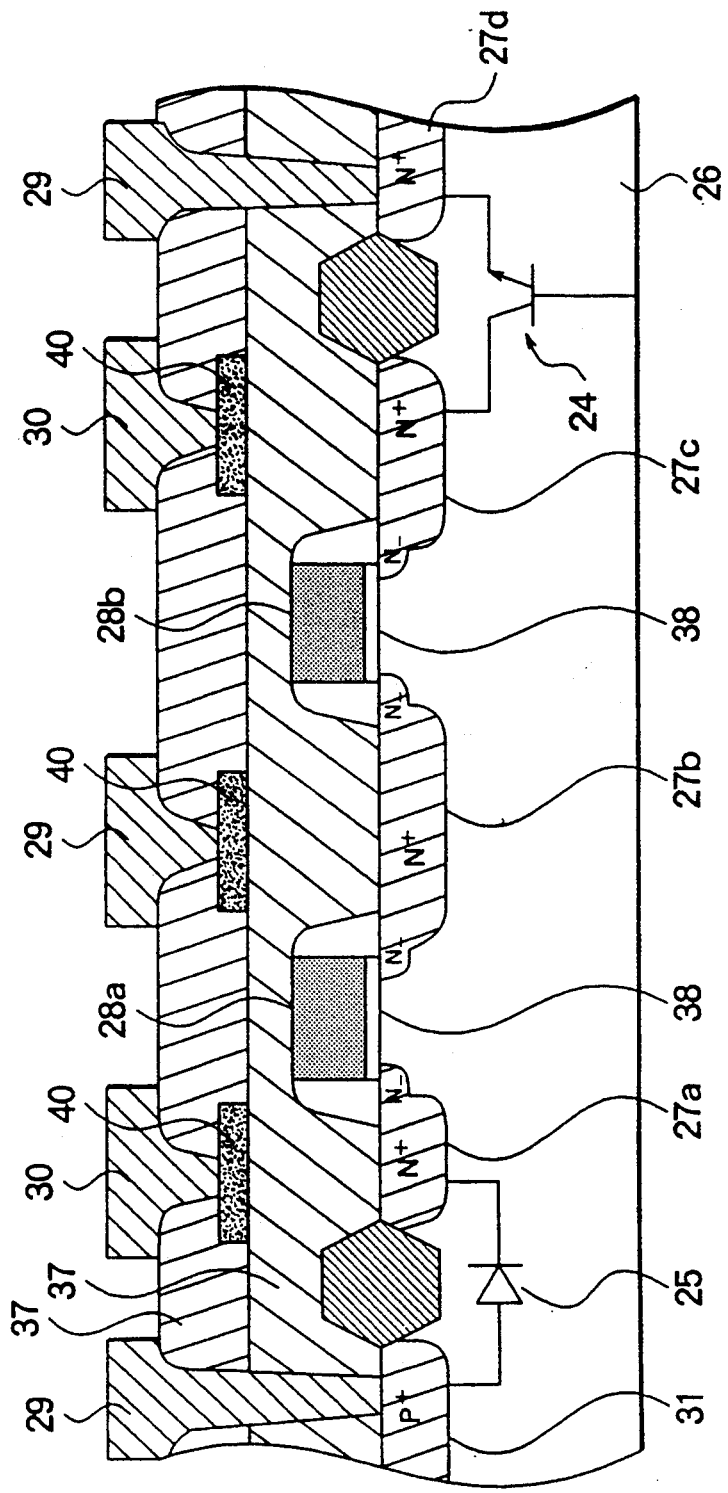
FIG. 8 is a cross-sectional view taken along line VIII—VIII in FIG. 7.
Figure 9:
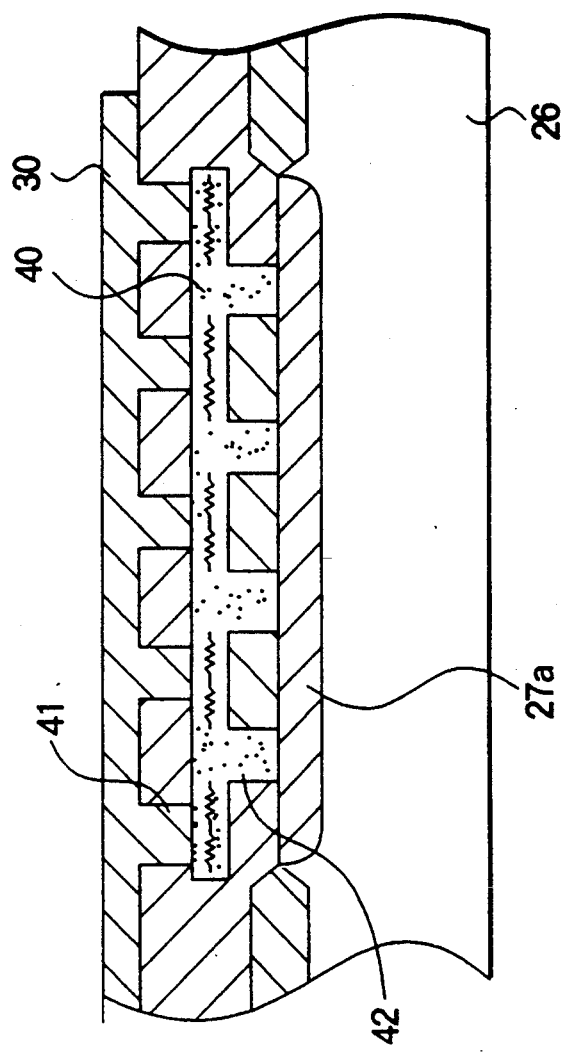
FIG. 9 is a cross-sectional view taken along line IX—IX in FIG. 7.

Next, a semiconductor device according to a second embodiment of the present invention will be described with reference to FIGS. 7 through 9. FIG. 7 shows a pattern layout of the input/output section while FIGS. 8 and 9 show cross-sections taken along lines VIII—VIII and IX—IX in FIG. 7, respectively. A circuit configuration of the input/output section in the semiconductor device according to the present embodiment is similar to that of the semiconductor device according to the first embodiment shown in FIG. 4.

The cross-section of the second embodiment is different from that of the first embodiment, as shown in FIGS. 8 and 9, in that a metal silicide pad films 40 including a refractory metal is formed between each of the electrodes 29 and 30 and corresponding one of the source region 27b and drain regions 27a of the output transistor 22. As shown in FIG. 9, each of the aluminium electrodes 29 and 30 is connected through an aluminum plug 41 to the metal silicide pad film 40 while the metal silicide film 40 is connected through a metal silicide plug 42 to each of the source and drain regions 27b and 27a. The metal silicide pad films 40 are formed as a second conductive layer for connecting the diffused regions 27a and 27b with the aluminum interconnections 29 and 30 through a high impedance to thereby increase the parasitic resistances 203 of the output transistor 22 without increasing the are of the diffused regions. As a result of the configuration, the protective transistor 24 functions more effectively, wherein the input/output section has a higher immunity against an ESD-induced destruction substantially without degrading a high-speed operation even when the second embodiment is applied to a high-speed LSI.

In the aforesaid embodiments, although the output transistor 22 is directly formed in the P-type semiconductor substrate 28, the output transistor 22 may be formed in a well region of the semiconductor substrate 26. Also, in the present invention, the output transistor 22 and the protective transistor 24 are both connected to the ground line or a first potential line. However, the protective transistor 24 may be connected to a high potential source line or a second potential line maintained at, for example, 3.3 V.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A semiconductor device comprising: a substrate having a semiconductive region of a first conductivity type; an internal circuit formed overlying and within said substrate; an input/output terminal for inputting/outputting signals for and from said internal circuit; a first and a second potential lines overlying said substrate; an output transistor including a gate electrode connected to said internal circuit and including in said semiconductive region, a drain region electrically connected to said input/output terminal, and a source region electrically connected to said first potential line, each of said source region and drain region having a second conductivity type opposite to said first conductivity type; a protective transistor including an emitter region formed in said semiconductive region and a collector implemented by said drain region and a base implemented by a portion of said semiconductive region, said emitter region having said second conductivity type and electrically connected to one of said first and second potential lines; and a field oxide film formed on said semiconductive region and interposed between said drain region and said emitter region, wherein a first parasitic resistance formed along a first path from said input/output terminal through said protective transistor to said one of said first and second potential lines is smaller than a second parasitic resistance formed along a second path from said input/output terminal through said output transistor to said first potential line.

2. A semiconductor device as defined in claim 1 wherein each of said drain region, source region and emitter region has an ohmic contact thereon for respective said electrical connections, and wherein a first sum of a first distance between the ohmic contact of said drain region and said isolating film and a second distance between the contact of said emitter region and said isolation film is smaller than a second sum of a third distance between the ohmic contact of said drain region and said gate electrode and a fourth distance between the contact of said source region and said gate electrode.

3. A semiconductor device as defined in claim 2 wherein a length of said gate electrode defining an effective channel length of said output transistor is larger than a width of said field oxide film defining an effective base width of said protective transistor.

4. A semiconductor device as defined in claim 1 wherein each of said drain region, source region and emitter region has an ohmic contact thereon for respective said electrical connections, and wherein said ohmic contacts for said drain region and source region includes a refractory metal silicide layer.

5. A semiconductor device as defined in claim 1 wherein a length of said gate electrode defining an effective channel length of said output transistor is larger than a width of said field oxide film defining an effective base width of said protective transistor.

6. A semiconductor device as defined in claim 1 wherein said semiconductive region is a well region formed within said substrate.

* * * * *

UNITED STATES PATENT AND TRADEMARK OFFICE
CERTIFICATE OF CORRECTION

PATENT NO.   : 5,449,939
DATED        : September 12, 1995
INVENTOR(S)  : Yoko HORIGUCHI and Kaoru NARITA It is certified that error(s) appears in the above-identified patent and that said Letters Patent is hereby corrected as shown below:

Col. 3, line 61, delete "fie" and insert --fine--.

Col. 4, line 27, delete "aground" and insert --a ground--.

Col. 5, line 1, delete "38" and insert --36--.

Col. 6, line 36, delete "28" and insert --26--.

Signed and Sealed this

Thirtieth Day of April, 1996

Attest:

BRUCE LEHMAN

*Attesting Officer*        Commissioner of Patents and Trademarks